US012575238B2

(12) United States Patent
Park et al.

(10) Patent No.: US 12,575,238 B2
(45) Date of Patent: Mar. 10, 2026

(54) DISPLAY DEVICE USING SEMICONDUCTOR LIGHT-EMITTING ELEMENT

(71) Applicant: LG ELECTRONICS INC., Seoul (KR)

(72) Inventors: Sungyun Park, Seoul (KR); Kisu Kim, Seoul (KR); Jinsung Kim, Seoul (KR); Indo Chung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 443 days.

(21) Appl. No.: 18/021,130

(22) PCT Filed: Aug. 21, 2020

(86) PCT No.: PCT/KR2020/011158
§ 371 (c)(1),
(2) Date: Feb. 13, 2023

(87) PCT Pub. No.: WO2022/039308
PCT Pub. Date: Feb. 24, 2022

(65) Prior Publication Data
US 2023/0307598 A1 Sep. 28, 2023

(51) Int. Cl.
*H10H 20/857* (2025.01)
*H01L 23/00* (2006.01)
*H01L 25/075* (2006.01)
(52) U.S. Cl.
CPC ........... *H10H 20/857* (2025.01); *H01L 24/24* (2013.01); *H01L 24/95* (2013.01);
(Continued)

(58) Field of Classification Search
CPC combination set(s) only.
See application file for complete search history.

(56) References Cited

U.S. PATENT DOCUMENTS

2019/0325790 A1* 10/2019 Park ...................... H10H 20/84
2020/0235077 A1* 7/2020 Jeon ...................... H01L 22/12
(Continued)

FOREIGN PATENT DOCUMENTS

KR 10-2016-0092396 A 8/2016
KR 10-2017-0026959 A 3/2017
(Continued)

*Primary Examiner* — Mark W Tornow
*Assistant Examiner* — Priya M Rampersaud
(74) *Attorney, Agent, or Firm* — Birch, Stewart, Kolasch & Birch, LLP

(57) ABSTRACT

A display device can include a base part; first electrodes which extend in one direction and which are formed on the base part at certain intervals; an insulating layer formed on the base part to cover the first electrodes; second electrodes which extend in the same direction as the first electrodes and which are formed on the insulating layer so as to be arranged between the first electrodes; a partition part stacked on the insulating layer and the second electrodes while forming assembly holes so as to be overlapped on the first electrodes and the second electrodes; semiconductor light-emitting elements placed in the assembly holes; and third electrodes arranged on the partition part. The semiconductor light-emitting elements are not electrically connected to the first electrodes and are electrically connected to the second electrodes and the third electrodes.

11 Claims, 13 Drawing Sheets

(52) U.S. Cl.
CPC .................... *H01L 25/0753* (2013.01); *H01L 2224/24145* (2013.01); *H01L 2224/95133* (2013.01); *H01L 2924/12041* (2013.01)

(56)                    References Cited

U.S. PATENT DOCUMENTS

| | | | | |
|---|---|---|---|---|
| 2022/0351993 A1* | 11/2022 | Jeong | ................ | H01L 21/67144 |
| 2022/0367774 A1* | 11/2022 | Kim | .................... | H01L 25/0753 |
| 2022/0415859 A1* | 12/2022 | Choi | ....................... | H10H 29/03 |
| 2023/0005887 A1* | 1/2023 | Kwon | ................ | H01L 25/0753 |

FOREIGN PATENT DOCUMENTS

| | | | | | |
|---|---|---|---|---|---|
| KR | 10-2019-0067296 A | | 6/2019 | | |
| KR | 10-2019-0096474 A | | 8/2019 | | |
| KR | 10-2020-0024177 A | | 3/2020 | | |
| KR | 10-2020-0026681 A | | 3/2020 | | |
| KR | 10-2020-0026775 A | | 3/2020 | | |
| KR | 20200026775 A | * | 3/2020 | ......... | H01L 25/0753 |
| KR | 10-2020-0046816 A | | 5/2020 | | |
| WO | WO-2020262752 A1 | * | 12/2020 | ......... | H01L 25/0753 |
| WO | WO-2021107237 A1 | * | 6/2021 | ......... | H01L 25/0753 |

* cited by examiner 155  154  153  159

155  154  153

159

156          155  154  153

159

150

159

150     161

161     150

1050

163          164

161c

1050

(a)                              (b)

(a)                              (b)

DISPLAY DEVICE USING SEMICONDUCTOR LIGHT-EMITTING ELEMENT

CROSS-REFERENCE TO RELATED APPLICATIONS

This application is the National Stage filing under 35 U.S.C. 371 of International Application No. PCT/KR2020/011158 filed on Aug. 21, 2020, which is hereby expressly incorporated by reference into the present application.

TECHNICAL FIELD

The present disclosure relates to a display device using semiconductor light-emitting elements, and more particularly, to a display device using micro-semiconductor light-emitting elements having a size of 10 μm or less.

BACKGROUND ART

In recent years, in the field of display technology, liquid-crystal displays (LCDs), organic light-emitting diodes (OLED) displays, microLED displays, etc. have been competing to realize large-scale displays.

Among others, displays using semiconductor light-emitting diodes (microLEDs) with a diameter or cross-sectional area less than 100 μm may offer very high efficiency because the displays do not need a polarizer to absorb light.

However, in order to implement large-scale microLED displays, several millions of semiconductor light-emitting diodes (elements) are required, which makes it difficult to transfer the devices compared to other technologies.

Some of the technologies currently in development for the transfer process of microLEDs include pick & place, laser lift-off (LLO), and self-assembly. Among these technologies, the self-assembly approach is a method that allows semiconductor light-emitting elements to find their positions on their own in a fluid, which is most advantageous in realizing large-screen display devices.

DISCLOSURE OF INVENTION

Technical Problem

One aspect of the present disclosure is to provide a display device having a structure capable of directly transferring micro-semiconductor light-emitting elements. In particular, the present disclosure provides a display device in which any one of pair electrodes can serve as an assembly electrode and a wiring electrode.

Another aspect of the present disclosure is to provide a display device including assembly electrodes provided to form a strong electric field over a large area during self-assembly.

Solution to Problem

A display device according to the present disclosure may include a base, first electrodes extending in one direction and disposed on the base at certain intervals, an insulating layer formed on the base to cover the first electrodes, second electrodes extending in the same direction as the first electrodes and formed on the insulating layer to be disposed between the adjacent first electrodes, a barrier rib stacked on the insulating layer and the second electrodes while forming assembly holes to overlap the first electrodes and the second electrodes, semiconductor light-emitting elements disposed inside the assembly holes, respectively, and third electrodes disposed on the barrier rib. The semiconductor light-emitting elements may not be electrically connected to the first electrodes, but may be electrically connected to the second electrodes and the third electrodes.

According to the present disclosure, the first electrodes and the second electrodes may include a first gap overlapping the assembly holes, and a second gap overlapping the barrier rib, and the first gap may be in a range of 2 μm to 6 μm.

According to the present disclosure, each of the first electrodes and each of the second electrodes may include a first protrusion and a second protrusion, respectively, protruding toward the assembly hole, and the first gap may be a distance between the first protrusion and the second protrusion.

According to the present disclosure, the second protrusion may overlap the assembly hole in a wider area than the first protrusion does.

According to the present disclosure, the insulating layer may be formed on the base to have a height step between a portion thereof covering the first electrodes and a portion not covering the first electrodes.

According to the present disclosure, each of the second electrodes may include an extension portion extending from one end of the second electrodes overlapping the assembly hole onto the insulating layer so as to cover a portion of the first electrodes.

According to the present disclosure, each of the semiconductor light-emitting elements may include a first conductive electrode, a first conductive semiconductor layer formed on the first conductive electrode, an active layer formed on the first conductive semiconductor layer, a second conductive semiconductor layer formed on the active layer, and a second conductive electrode formed on the second conductive semiconductor layer. The first conductive electrode may be electrically connected to the second electrodes, and the second conductive electrode may be electrically connected to the third electrodes.

According to the present disclosure, the second electrodes may be formed to contain at least one of Sn, Ag, Cu, Pb, Al, Cr, Bi, Cd, Fe, In, Ni, Sb, Zn, Co Au.

According to the present disclosure, the display device may further include a planarization layer formed on the barrier rib while filling an inside of each assembly hole, and the third electrodes may be formed on the planarization layer.

According to the present disclosure, the third electrodes may be made of a transparent electrode material.

Advantageous Effects of Invention

According to the present disclosure, since pair electrodes are arranged at distances within several μm, micro-sized semiconductor light-emitting elements having a size of several μm can be assembled.

An arrangement structure of assembly electrodes according to the present disclosure can have horizontal and vertical electric field gradients, and thus an electric field can be formed with strong intensity in a wide area during self-assembly. This can improve an assembly rate of the semiconductor light-emitting elements.

According to the present disclosure, any one of pair electrodes can be exposed through an assembly hole so as to be used as a wiring electrode of the semiconductor light-emitting element seated in the assembly hole, which can allow a direct transfer of the semiconductor light-emitting element.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the embodiment described herein can be applied as long as it can include a display even in a new product form to be developed later.

Figure 1:
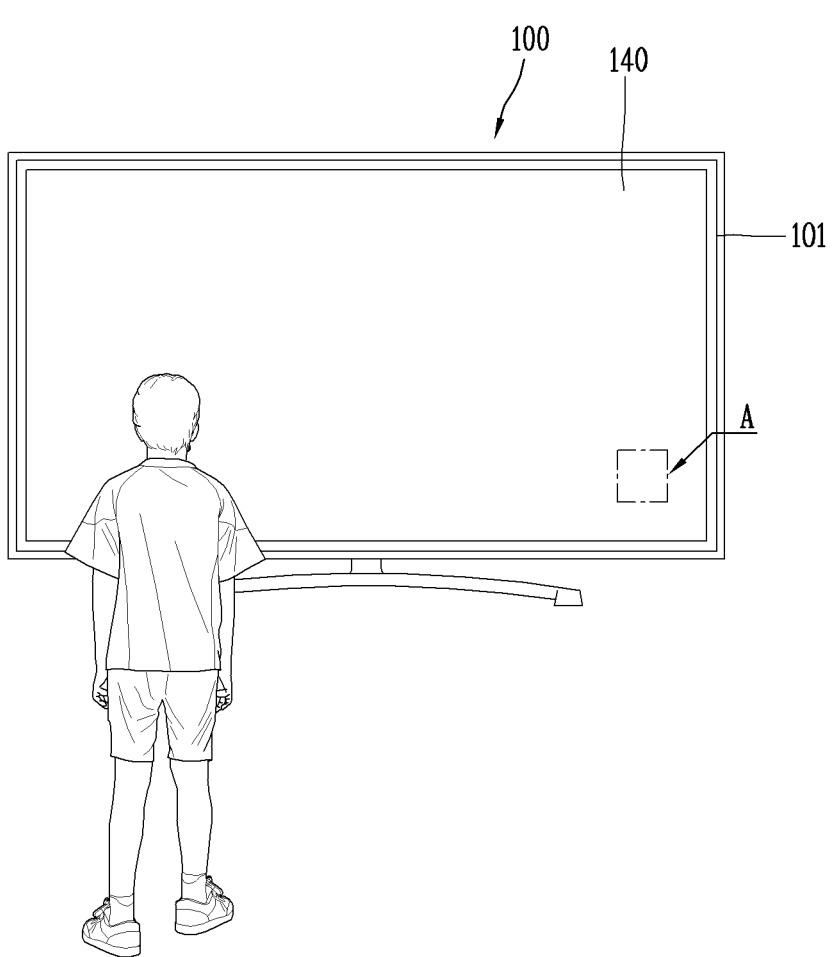
FIG. 1 is a conceptual view illustrating one embodiment of a display device using semiconductor light-emitting elements.
Figure 2:
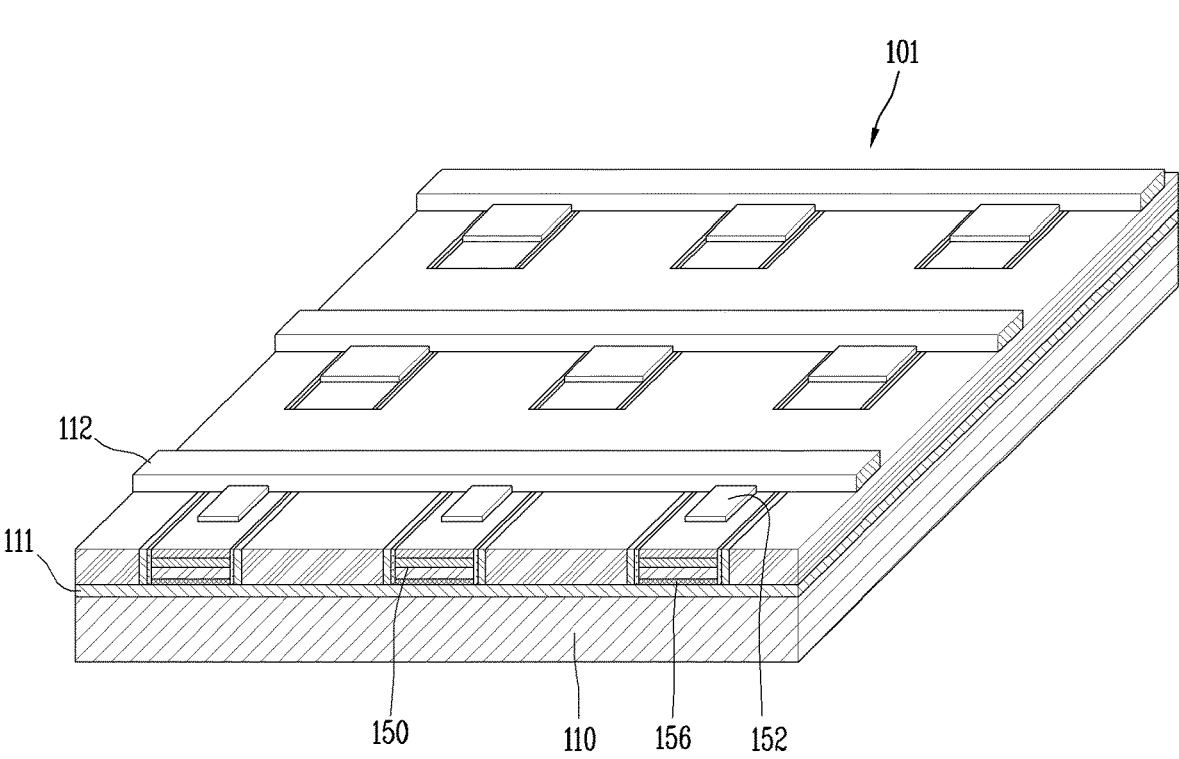
FIG. 2 is a partial enlarged view of a portion A in the display device of FIG. 1.
Figure 3:
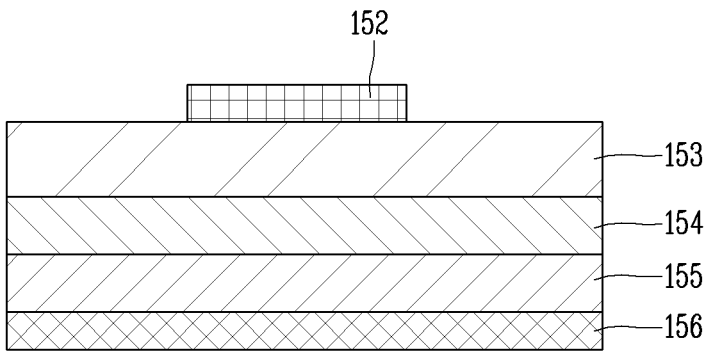
FIG. 3 is an enlarged view of the semiconductor light-emitting element of FIG. 2.
Figure 4:
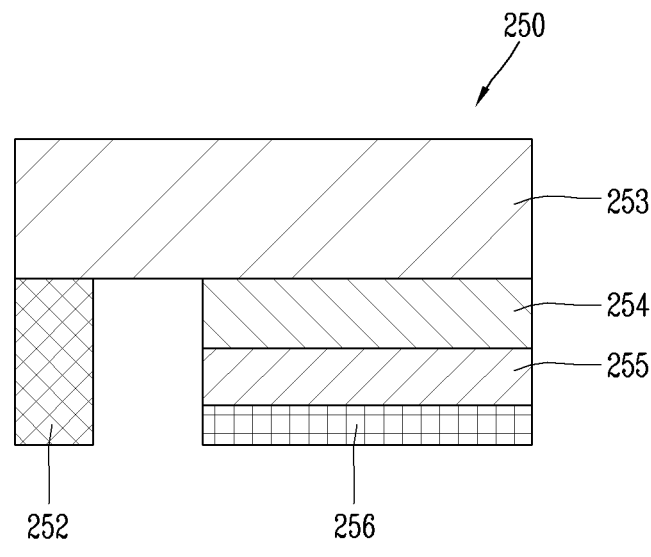
FIG. 4 is a view illustrating another embodiment of the semiconductor light-emitting element of FIG. 2.

FIG. 1 is a conceptual view illustrating one embodiment of a display device using semiconductor light-emitting elements, FIG. 2 is a partial enlarged view of a portion A in the display device of FIG. 1, FIG. 3 is an enlarged view of the semiconductor light-emitting element of FIG. 2, and FIG. 4 is a view illustrating another embodiment of the semiconductor light-emitting element of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting elements) as an example of the semiconductor light-emitting elements 150 which convert current into light. The microLEDs may be light-emitting elements that are small in size less than 100 μm. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

The vertical type semiconductor light-emitting element includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a flip-type light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. The micro-sized semiconductor light-emitting elements 150 should be transferred onto preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting elements. In addition, the self-assembly method described in this specification can be applied to both horizontal semiconductor light-emitting elements and vertical semiconductor light-emitting elements.

Figure 5A:
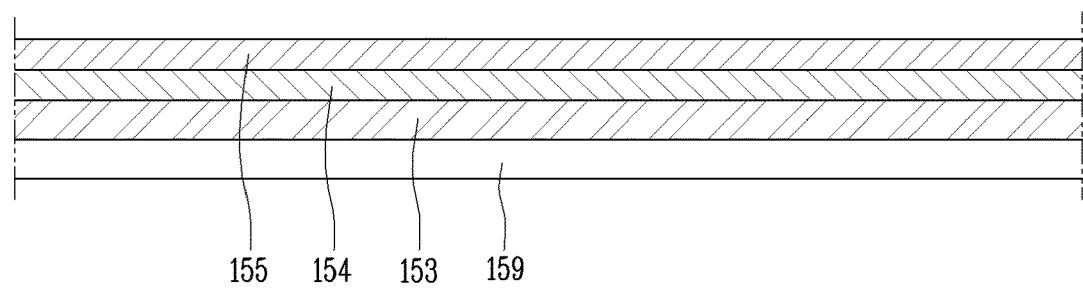
FIGS. 5A to 5E are conceptual diagrams illustrating a new process for manufacturing a semiconductor light-emitting element.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary embodiment is illustrated by assuming the presence of the active layer, the active layer may be omitted, if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
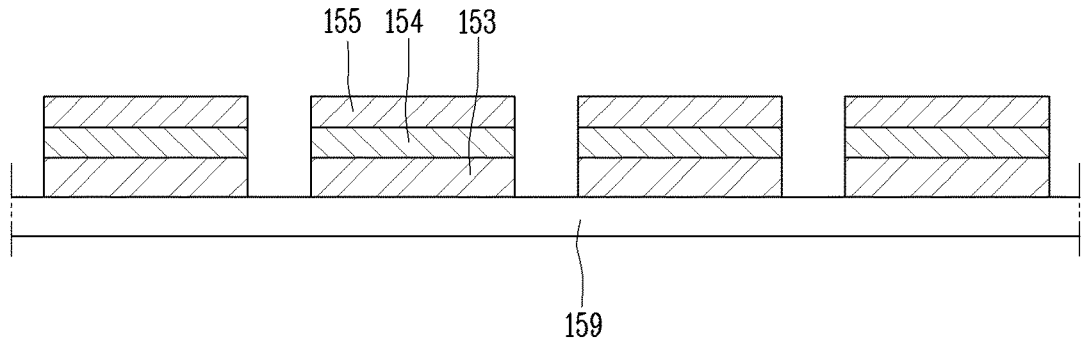

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting element array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
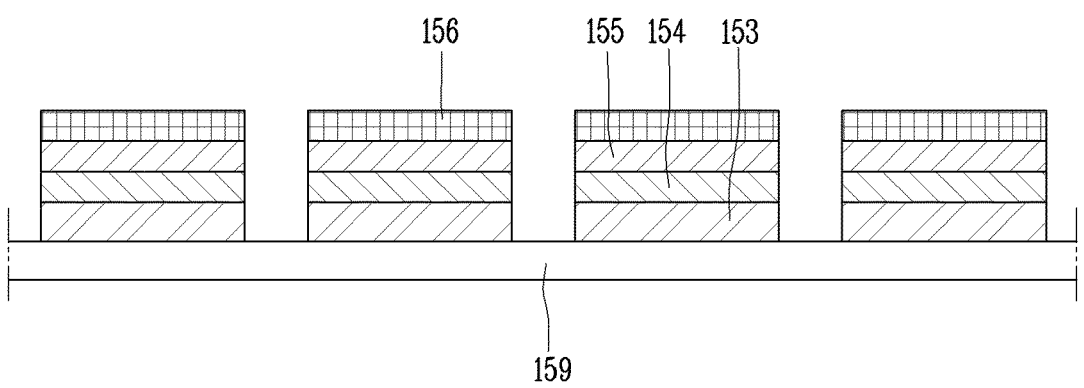

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
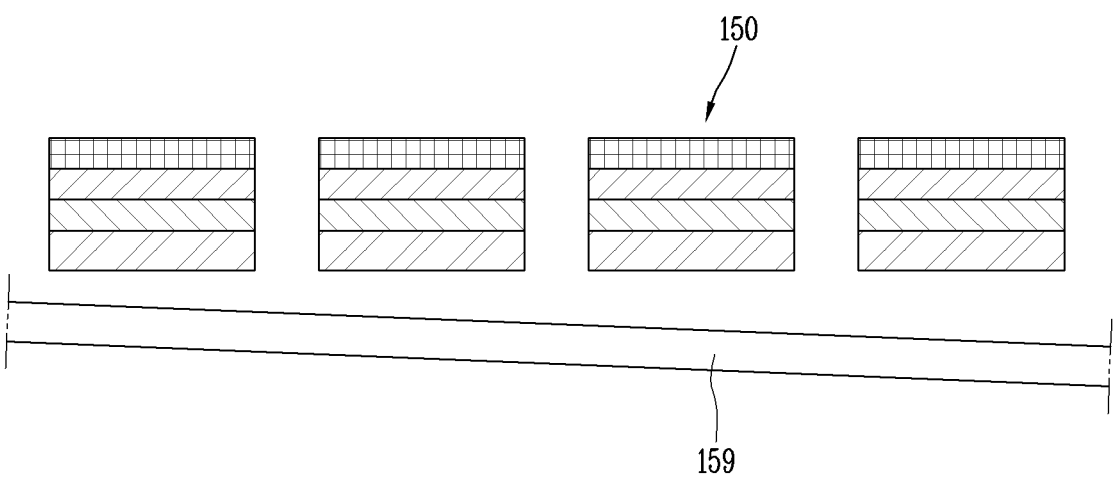

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
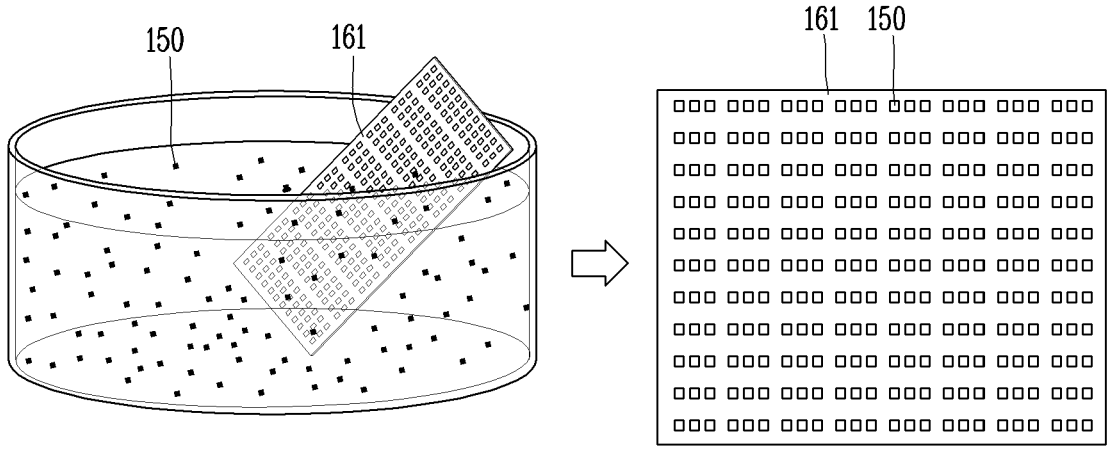

Afterwards, the step of mounting the semiconductor light-emitting elements 150 on a substrate in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not shown) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
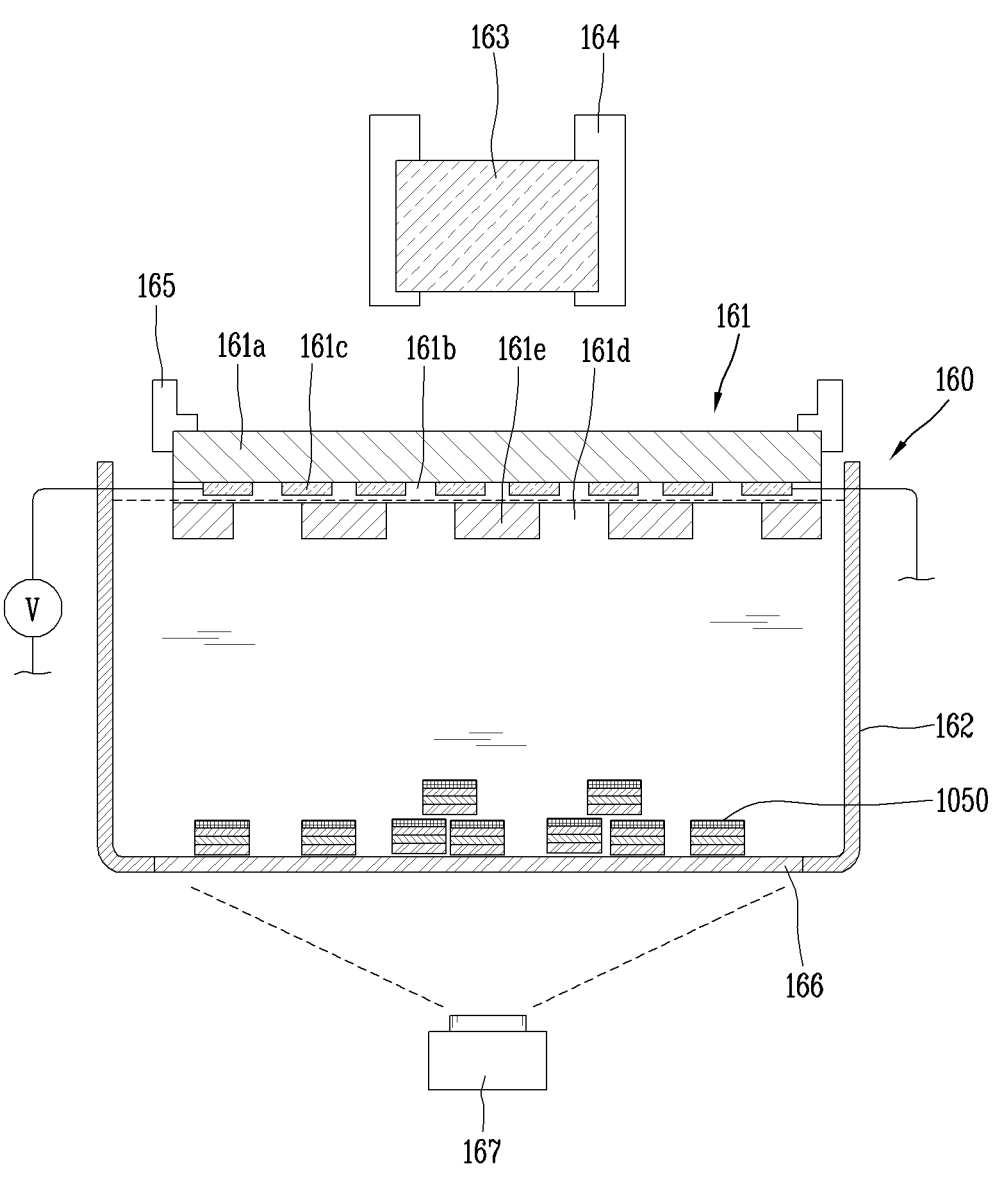
FIG. 6 is a conceptual diagram illustrating one embodiment of a device for self-assembling semiconductor light-emitting elements according to the present disclosure.
Figure 7:
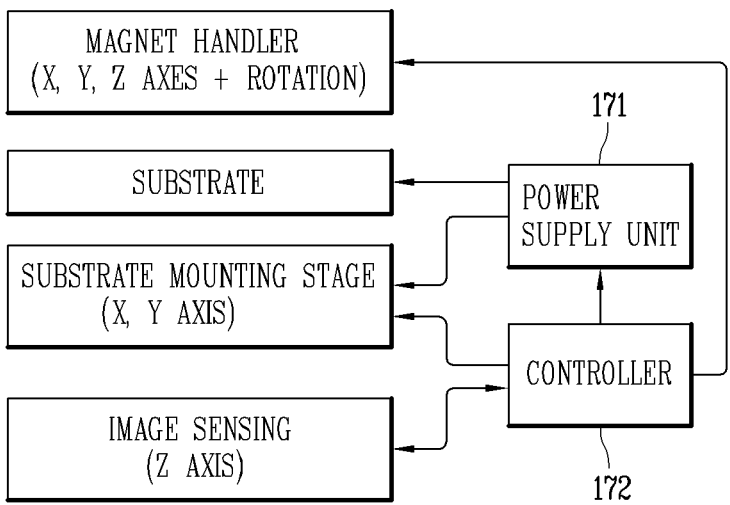
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of an inorganic material such as SiO2, SiNx, SiON, Al2O3, TiO2, HfO2, etc. Alternatively, the dielectric layer 161b may be an organic insulator and configured as a single layer or a multi-layer. The thickness of the dielectric layer 161b may range from several tens of nm to several μm.

Further, the substrate 161 according to the present disclosure includes a plurality of cells 161d that are separated by barrier walls. The cells 161d may be sequentially arranged in one direction and made of a polymer material. Furthermore, the barrier walls 161e defining the cells 161d may be made to be shared with neighboring cells 161d. The barrier walls 161e may protrude from the base portion 161a, and the cells 161d may be sequentially arranged in one direction by the barrier walls 161e. More specifically, the cells 161d may be sequentially arranged in column and row directions and have a matrix configuration.

As illustrated in the drawings, the cells 161d may have recesses for receiving the semiconductor light-emitting elements 150, and the recesses may be spaces defined by the barrier walls 161e. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting elements are circular. Moreover, each of the cells is configured to accommodate a single semiconductor light-emitting element. In other words, a single semiconductor light-emitting element is accommodated in a single cell.

Meanwhile, the plurality of electrodes 161c may have a plurality of electrode lines that are placed on bottoms of the cells 161d, and the plurality of electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting elements can be inserted into the cells 161d by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting element may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056a and a second layer 1056b, as illustrated in FIG. 9. Here, the first layer 1056a may include a magnetic material, and the second layer 1056b may include a metal material other than the magnetic material.

As illustrated in the drawing, in this example, the first layer 1056a including the magnetic material may be disposed in contact with the second conductive semiconductor layer 1055. In this case, the first layer 1056a may be disposed between the second layer 1056b and the second conductive semiconductor layer 1055. The second layer 1056b may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
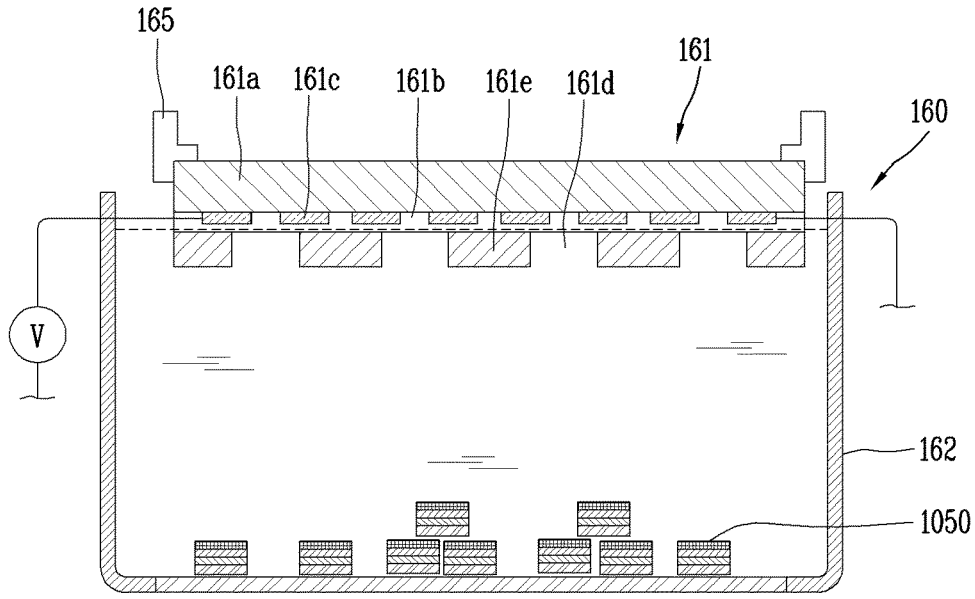
FIGS. 8A to 8E are conceptual views illustrating a process for self-assembling semiconductor light-emitting elements using the self-assembly device of FIG. 6.
Figure 9:
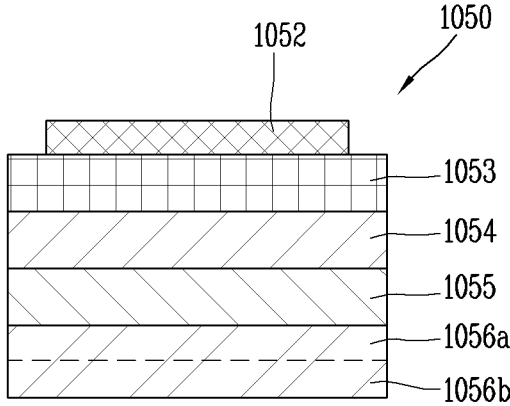
FIG. 9 is a view illustrating one embodiment of a semiconductor light-emitting element that is used in the self-assembly process of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
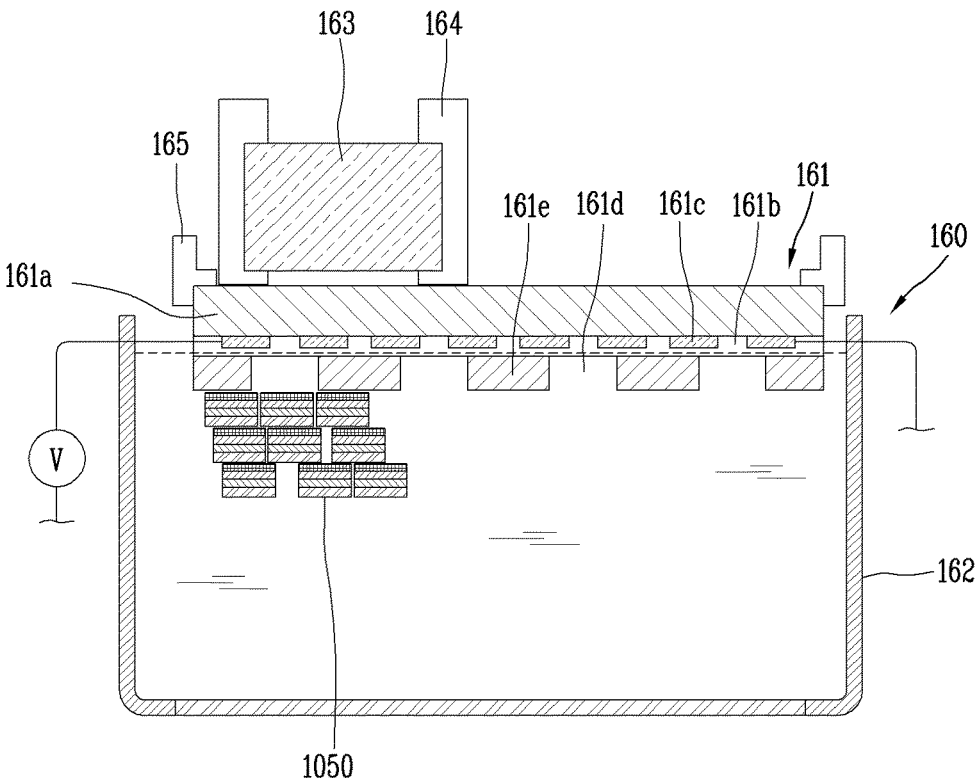

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this embodiment, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
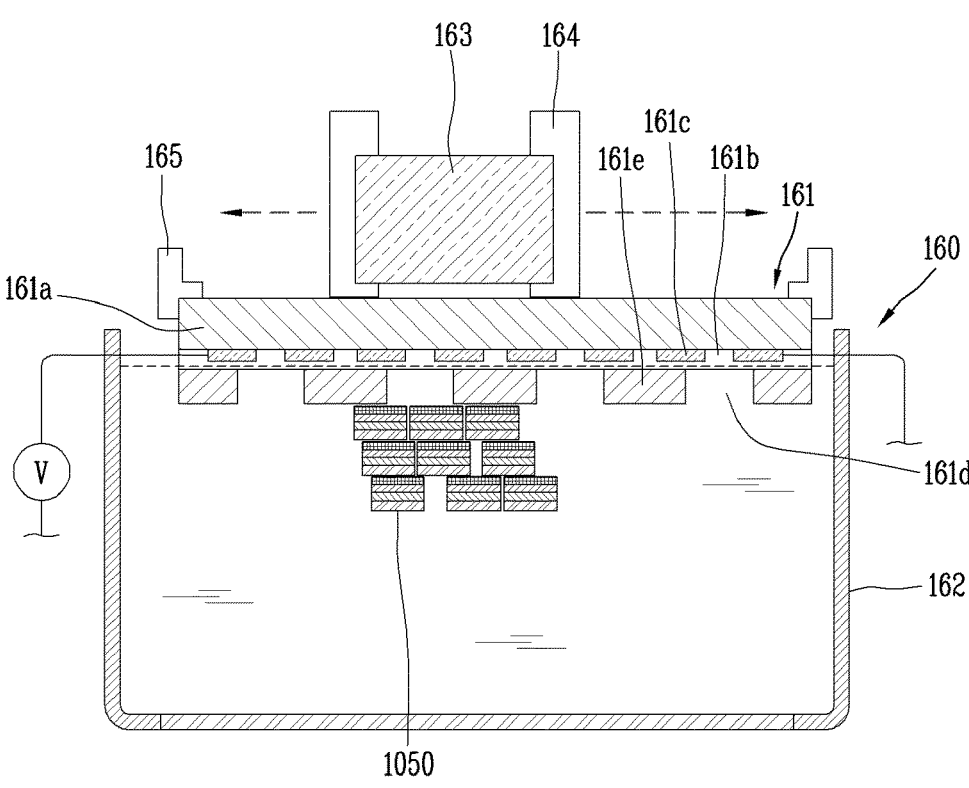

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
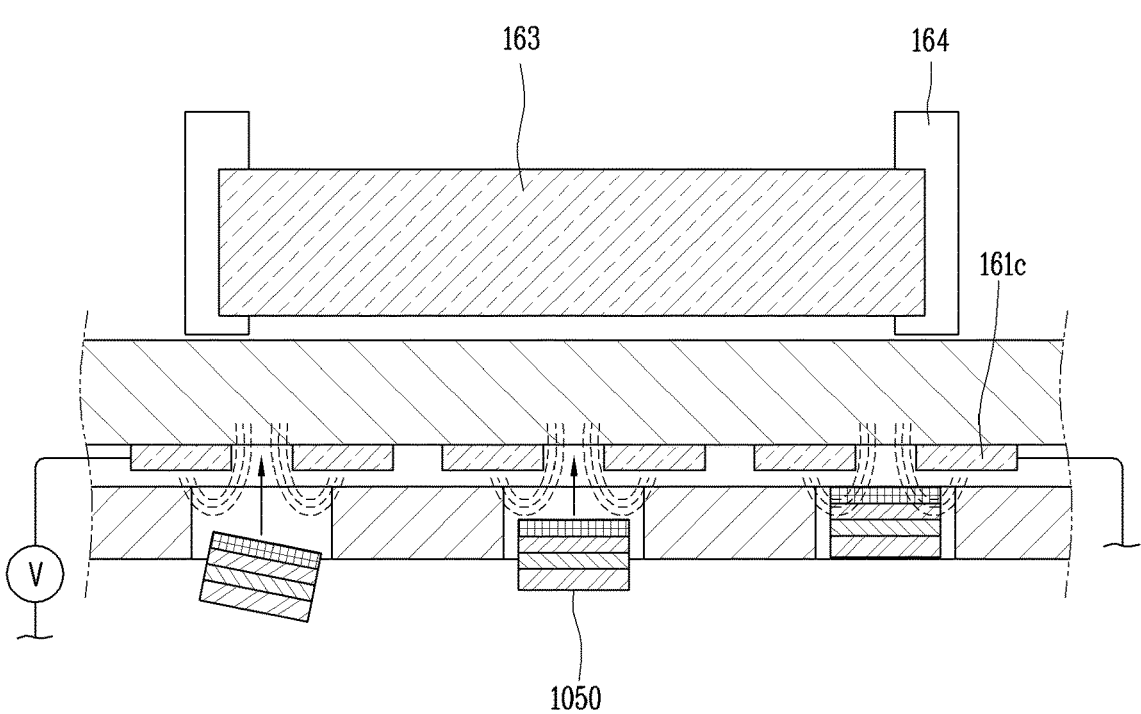
Figure 8E:
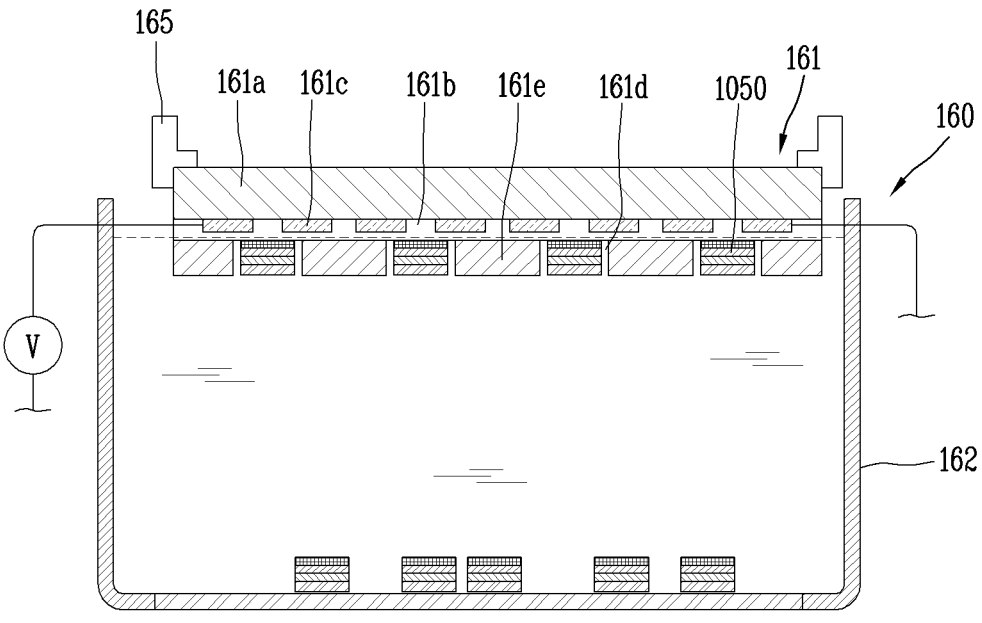

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

The present disclosure relates to a display device of a new structure using semiconductor light-emitting elements, particularly, micro-LEDs. Specifically, the display device according to the present disclosure has a structure capable of directly transferring micro-semiconductor light-emitting elements having a size of several μm or less. Hereinafter, various embodiments according to the present disclosure will be described with reference to the accompanying drawings.

Figure 10:
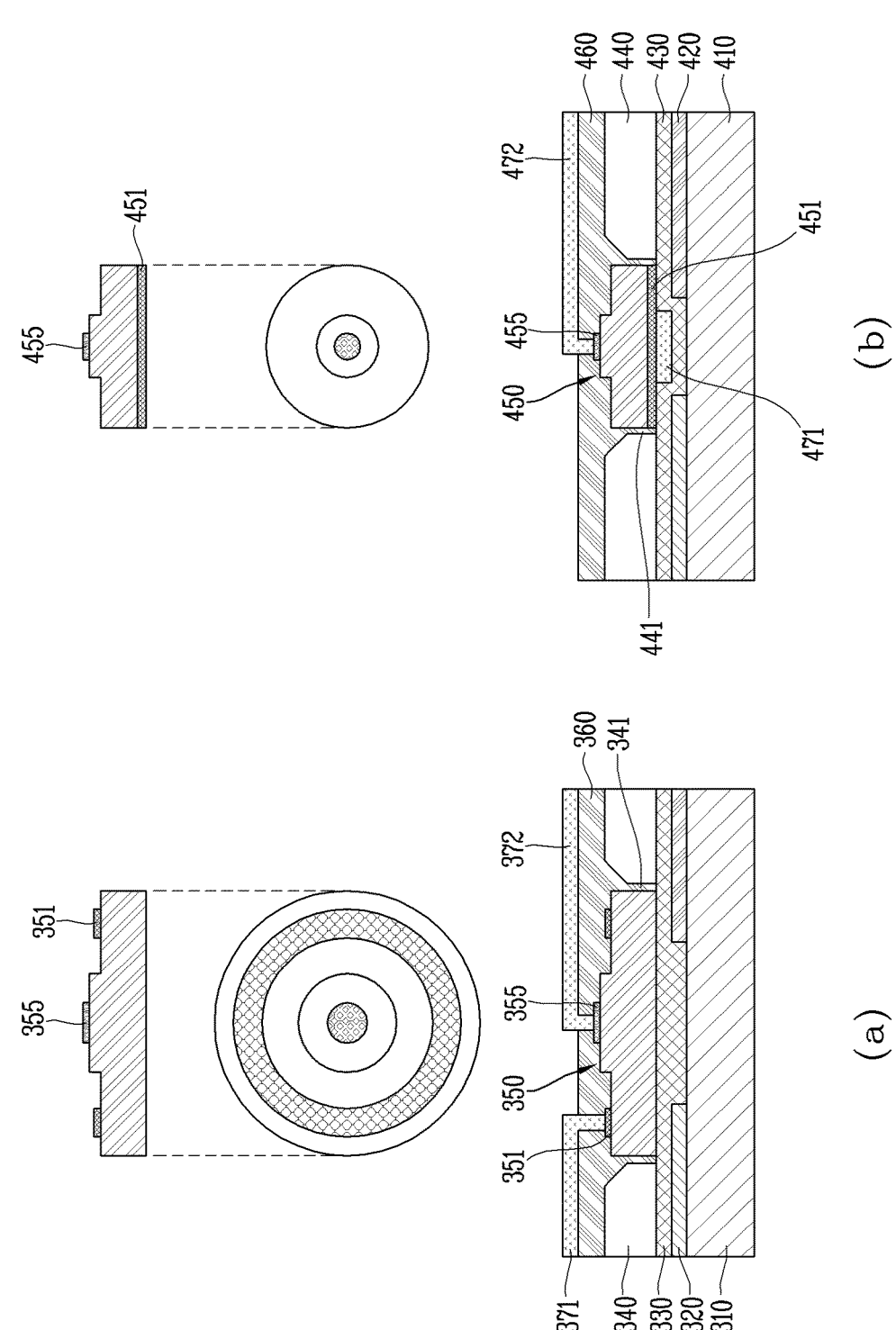
FIG. 10 is a diagram illustrating embodiments of a display device using a horizontal semiconductor light-emitting element and a vertical semiconductor light-emitting element according to the related art.

FIG. 10 is a diagram illustrating embodiments of a display device using a horizontal semiconductor light-emitting element and a vertical semiconductor light-emitting element according to the related art. First, a structure of a display device using semiconductor light-emitting elements according to the related art and limitations of the related art structure will be described, with reference to FIG. 10.

The related art display device includes horizontal or vertical semiconductor light-emitting elements having a size of several tens of μm. The semiconductor light-emitting element described herein is a semiconductor light-emitting element having a symmetrical structure, such as a circular shape or an elliptical shape, and the size corresponds to a diameter of the semiconductor light-emitting element. Such horizontal and vertical types may be divided depending on an arrangement of an n-electrode and a p-electrode of the semiconductor light-emitting element. Specifically, the n-electrode and the p-electrode of the horizontal semiconductor light-emitting element are arranged on an epitaxial layer to face the same direction while the n-electrode and the p-electrode of the vertical semiconductor light-emitting element are arranged on the epitaxial layer to face opposite directions. Since the n-electrode and the p-electrode of the vertical semiconductor light-emitting element can be disposed on different surfaces, it is advantageous in terms of miniaturization of the semiconductor light-emitting element.

When the related art display device includes horizontal semiconductor light-emitting elements, the display device may have a structure as illustrated in (a) of FIG. 10, in order for a substrate, to which the semiconductor light-emitting elements have been transferred through self-assembly, to be used as a wiring substrate.

Referring to (a) of FIG. 10, in the display device 300, assembly electrodes 320 for self-assembly and an insulating layer 330 for covering the assembly electrodes 320 are disposed on a base 310. On the insulating layer 330, a barrier rib (or partition part) 340 is stacked on the insulating layer 330 while forming an assembly hole 341 in which a semiconductor light-emitting element 350 is seated. The assembly hole 341 may overlap the assembly electrodes 320 so that an electric field is formed inside the assembly hole 341, and the semiconductor light-emitting element 350 may be seated in the assembly hole 341 by dielectrophoresis. A planarization layer 360 may be stacked on the barrier rib 340 while filling the inside of the assembly hole 341, and wiring electrodes 370 (a first wiring electrode 371 and a second wiring electrode 372), which are electrically connected to an n-electrode 351 and a p-electrode 355 of the semiconductor light-emitting element 350 may be disposed on the planarization layer 360.

Since the horizontal semiconductor light-emitting element as illustrated in (a) of FIG. 10 has the n-electrode and the p-electrode that are disposed on an epitaxial layer to face the same direction, it is improper as a structure of a semiconductor light-emitting element having a size of several μm.

On the other hand, when the related art display device includes vertical semiconductor light-emitting elements, the display device may have a structure as illustrated in (b) of FIG. 10, in order for a substrate, to which the semiconductor light-emitting elements have been transferred through self-assembly, to be used as a wiring substrate.

As described above, the n-electrode and the p-electrode of the vertical semiconductor light-emitting element are disposed on different surfaces of the epitaxial layer, a small-sized semiconductor light-emitting element can be implemented, and furthermore, a semiconductor light-emitting element having a size of several μm can be manufactured.

However, due to a structural characteristic of the vertical semiconductor light-emitting element, as illustrated in (b) of FIG. 10, wiring electrodes 470 must also be disposed above and below a semiconductor light-emitting element 450, respectively. Specifically, a first wiring electrode 471 electrically connected to an n-electrode 451 of the semiconductor light-emitting element 450 is disposed on a dielectric layer 430 and a second wiring electrode 472 electrically connected to a p-electrode 455 is disposed on a planarization layer 460. In particular, the first wiring electrode 471 is disposed not to overlap assembly electrodes 420 so that an electric field is not shielded during self-assembly.

In this structure, if the vertical semiconductor light-emitting element is manufactured in a size of several μm, the assembly electrodes 420 must be patterned at narrower gaps, and the first wiring electrode 471 electrically connected to the n-electrode 451 must be patterned with a narrower width so as not to overlap the assembled electrodes 420. However, the photolithography process has limitations in narrowing the patterns of the electrodes.

The present disclosure provides a display device having a structure for solving the above problems. According to the present disclosure, after self-assembly, some assembly electrodes may be electrically connected to the semiconductor light-emitting elements to be used as wiring electrodes.

Figure 11:
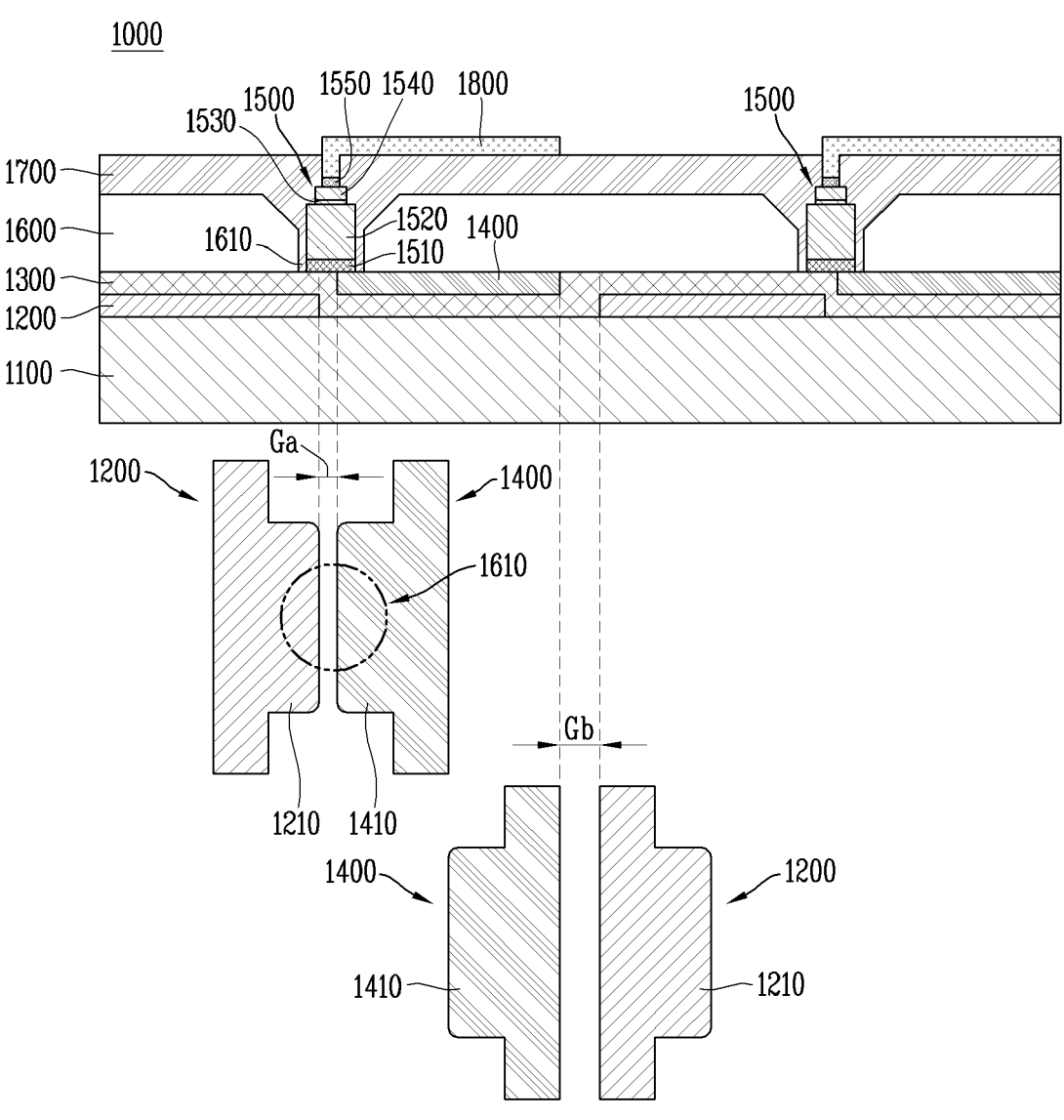
FIG. 11 is a view illustrating a display device in accordance with one embodiment of the present disclosure.

FIG. 11 is a view illustrating a display device in accordance with one embodiment of the present disclosure. Hereinafter, a display device according to the present disclosure will be described with reference to FIG. 11.

A display device 1000 according to the present disclosure may use vertical semiconductor light-emitting elements (hereinafter, referred to as semiconductor light-emitting elements 1500) having a diameter of 10 μm or less. According to the present disclosure, each of the semiconductor light-emitting elements 1500 may include a first conductive electrode 1510, a first conductive semiconductor layer 1520 formed on the first conductive electrode 1510, an active layer 1530 disposed on the first conductive semiconductor layer 1520, a second conductive semiconductor layer 1540 disposed on the active layer 1530, and a second conductive electrode 1550 disposed on the second conductive semiconductor layer 1540. In this embodiment, the first conductive type may be n-type, and the second conductive type may be p-type. However, it is not limited thereto, and an embodiment in which the first conductive type is p-type and the second conductive type is n-type is also possible.

According to the present disclosure, a base 1100 may be made of an insulating material that is flexible. For example, the base 1100 may be made of a material, such as polyimide (PI), glass, or the like, but may not be limited thereto.

First electrodes 1200 may be disposed on the base 1100. The first electrodes 1200 may be bar-shaped electrodes extending in one direction, and may be disposed on the base 1100 at predetermined gaps.

The first electrodes 1200 may be assembly electrodes that form electric fields during self-assembly. In detail, the assembly electrode may be provided in plurality, to apply different voltage signals to adjacently-disposed electrodes. At this time, two adjacent electrodes to which different voltage signals are applied may form pair electrodes. In the present disclosure, each first electrode 1200 may be any one of two electrodes defining the pair electrodes.

The first electrode 1200 may be made of a non-resistant or low-resistant metal material for voltage transfer, and may be configured as a single layer or a multi-layer. For example, the first electrode 1200 may be a single layer formed of Al or Cu or may be a multi-layer, such as Mo/Al/Mo, Ti/Al/Ti, Ti/Cu/Ti, etc., which include Al or Cu. The first electrodes 1200 each may have a thickness of 50 nm to 300 nm.

An insulating layer 1300 that covers the first electrodes 1200 may be disposed on the base 1100. The insulating layer 1300 may electrically insulate the first electrodes 1200 from second electrodes 1400 to be described later. To this end, the insulating layer 1300 may be made of an inorganic insulating material such as $SiO_2$, $SiN_x$ or $Al_2O_3$ and may be configured as a single layer or a multi-layer.

The insulating layer 1300 may also have a thickness by which the first electrodes 1200 and the second electrodes 1400 can be electrically disconnected from each other. For example, the insulating layer 1300 may be formed to have a thickness of 50 to 3000 nm, preferably, several hundred of nm. If the thickness of the insulating layer 1300 is too thin, the first electrodes 1300 and the second electrodes 1400 may be electrically connected to each other. On the other hand, if the thickness of the insulating layer 1300 is too thick, dielectrophoretic force may be reduced. Therefore, the insulating layer 1300 may be formed to have a thickness within the aforementioned range.

The insulating layer 1300 may be formed to have a height step a between a portion covering the first electrode 1200 and a portion not covering the first electrode 1200. The height step a between the portion covering the first electrode 1200 and the portion not covering the first electrode 1200 may correspond to a thickness of the second electrode 1400 disposed on the insulating layer 1300.

The second electrodes 1400 may be disposed on the insulating layer 1300. The second electrodes 1400 may be bar-shaped electrodes extending in one direction, and may be disposed on the insulating layer 1300 at predetermined gaps.

Specifically, the second electrodes 1400 may extend in the same direction as the first electrodes 1200 and may be disposed to be horizontal or parallel to the first electrodes 1200 on different planes. The second electrode 1400 may be disposed between the first electrodes 1200 on the insulating layer 1300. That is, the second electrodes 1400 may be formed on a region of the insulating layer 1300 where the insulating layer 1300 does not cover the first electrodes 1200. As the second electrodes 1400 are disposed, the height step a of the insulating layer 1300 can be solved.

The second electrodes 1400 may be assembly electrodes that form electric fields during self-assembly. That is, each second electrode 1400 may be any one of two electrodes defining the pair electrodes. Also, according to the present disclosure, the second electrodes 1400 may be electrically connected to the semiconductor light-emitting element 1500 to become wiring electrodes that control turn-on/off of the semiconductor light-emitting element 1500. Accordingly, the second electrodes 1400 may be formed to contain at least one of Sn, Ag, Cu, Pb, Al, Cr, Bi, Cd, Fe, In, Ni, Sb, Zn, Co, and Au. The second electrode 1400 may be configured as a single layer made of any one of the materials listed above or a multi-layer made of two or more materials listed above. When the second electrode 1400 is configured as a multi-layer, at least a portion of the second electrode 1400 that is in contact with the semiconductor light-emitting element 1500 may be formed of a material with a low melting point, such as Sn, In, or Pb, which is easily soldered.

Meanwhile, a barrier rib 1600 may be stacked on the insulating layer 1300 and the second electrodes 1400. The barrier rib 1600 may be stacked on the insulating layer 1300 and the second electrodes 1400 while forming assembly holes 1610 to overlap the first electrodes 1200 and the second electrodes 1400. Each of the assembly holes 1610 may be formed by etching the barrier rib 1600 in a thickness direction, and thus portions of the insulating layer 1300 and the second electrode 1400 may be exposed through the assembly hole 1610. The barrier rib 1600 may be formed of an inorganic insulating material such as SiO2 or SiNx, or may alternatively be formed of an organic material. In addition, the barrier rib may be formed to have a thickness of several tens to several hundreds of nm.

The semiconductor light-emitting elements 1500 may be seated in the assembly holes 1610 through self-assembly. Since the assembly holes 1610 overlap the first electrodes 1200 and the second electrodes 1400, as voltage is applied to the first electrodes 1200 and the second electrodes 1400, electric fields may be formed inside the assembly holes 1610, and thus the semiconductor light-emitting elements 1500 may be seated inside the assembly holes 160 by dielectrophoresis.

According to the present disclosure, in order to assemble the semiconductor light-emitting elements 1500 having a size of 10 μm or less, the first electrodes 1200 and the second electrodes 1400 may be disposed at distances of several μm. Specifically, referring to the drawing, a distance between the first electrodes 1200 and a distance between the second electrodes 1400 may be several tens of μm, but a horizontal distance between the first electrode 1200 and the second electrode 1400 may be about several μm. That is, a structure in which the first electrodes 1200 and the second electrodes 1400 are isolated from each other by the insulating layer 1300 can solve a problem occurred in an electrode pattern formation process through photolithography.

Referring to FIG. 11, the first electrode 1200 and the second electrode 1400 may have a first gap Ga overlapping the assembly hole 1610 and a second gap Gb overlapping the barrier rib 1600. At this time, a gap having the aforementioned distance of several μm may be the first gap Ga overlapping the assembly hole 1610, and the first gap Ga may be in the range of 2 μm to 6 μm.

The first electrode 1200 and the second electrode 1400 may respectively include a first protrusion 1210 and a second protrusion 1410 protruding toward the assembly hole 1610. When the first electrode 1200 and the second electrode 1400 include the first protrusion 1210 and the second protrusion 1410, respectively, the first gap Ga may be a distance between the first protrusion 1210 and the second protrusion 1410 that overlaps the assembly hole 1610.

Meanwhile, the semiconductor light-emitting element 1500 may be in contact with the second electrode 1400 exposed through the assembly hole 1610 while being seated in the assembly hole 1610, and may also be electrically connected to the second electrode 1400 through heat treatment. In detail, the first conductive electrode 1510 of the semiconductor light-emitting element and the second electrode 1400 may be electrically connected to each other. Accordingly, the second electrode 1400 forming an ohmic contact with the first conductive electrode 1510 may overlap the assembly hole 1610 in a wider area than the first electrode 1200. When the first protrusion 1210 and the second protrusion 1410 are included, an overlap area between the second protrusion 1410 and the assembly hole 1610 may be wider than an overlap area between the first protrusion 1210 and the assembly hole 1610. A manner for implementing this structure is not limited.

Figure 12:
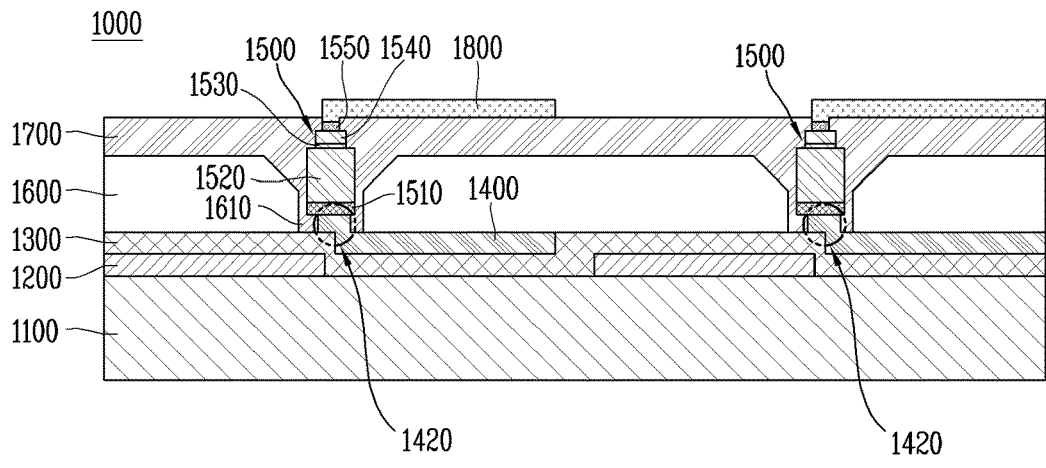
FIG. 12 is a view illustrating a display device in accordance with another embodiment of the present disclosure.

FIG. 12 is a view illustrating a display device in accordance with another embodiment of the present disclosure. Referring to FIG. 12, the second electrode 1400 may include an extension portion 1420 that extends from one end of the second electrode 1400 overlapping the assembly hole 1610 onto the insulating layer 1300 to cover a portion of the first electrode 1200. That is, according to the embodiment of FIG. 12, the first electrode 1200 and the second electrode 1400 may have portions overlapping each other vertically. Such a structure may form a stronger electric field in the assembly hole 1610 during self-assembly, and a description regarding this will be given later.

Meanwhile, a planarization layer 1700 may be formed on the barrier rib 1600. The planarization layer 1700 may be formed on the barrier rib 1600 while filling empty spaces inside the assembly holes 1610 in a state where the semiconductor light-emitting elements 1500 have been seated in the assembly holes 1610. The planarization layer 1700 may planarize one surface of each semiconductor light-emitting element 1500 while fixing the semiconductor light-emitting element 1500. The planarization layer 1700 may be formed of a transparent polymer material that has flexibility and insulating property or a photosensitive organic material.

Third electrodes 1800 may be formed on the planarization layer 1700. The third electrodes 1800 may be formed as wiring electrodes, which control turn-on/off of the semiconductor light-emitting elements 1500, by a wiring process after being self-assembled. The third electrodes 1800 may be electrically connected to the second conductive electrode 1550 of the semiconductor light-emitting element. The third electrodes 1800 may be formed of a transparent electrode material to implement the display device 1000 having a top-emission structure, and the second conductive electrode 1550 may also be formed of a transparent electrode material.

That is, the display device 1000 according to the present disclosure may include the first electrodes 1200, the second electrodes 1400, and the third electrodes 1800, and the semiconductor light-emitting elements 1500 may be electrically connected to the second electrodes 1400 and the third electrodes 1800 and may not be electrically connected to the first electrodes 1200.

Figure 13:
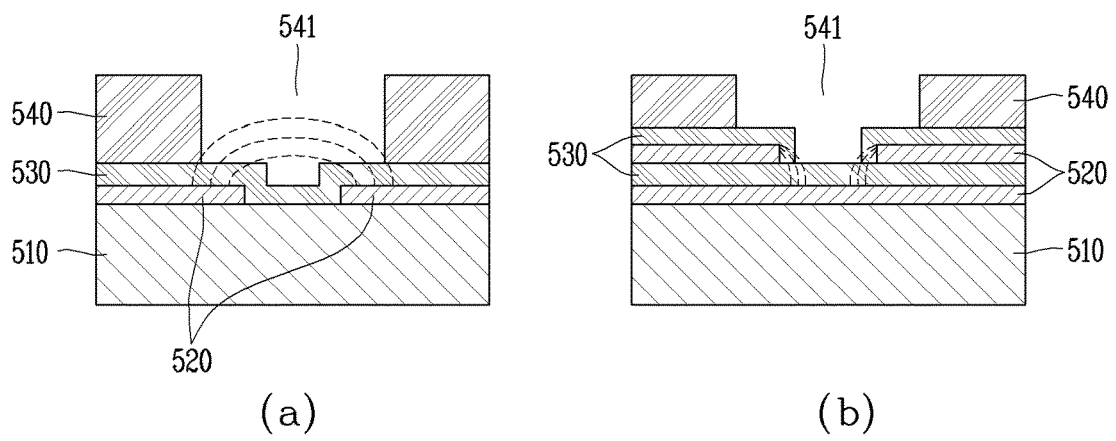
FIG. 13 is a view illustrating a shape of an electric field formed inside an assembly hole according to the related art assembly electrode structure.

Hereinafter, a shape of an electric field formed inside the assembly hole 1610 in the display device 1000 according to the present disclosure will be described. FIG. 13 is a view illustrating a shape of an electric field formed inside an assembly hole according to the related art assembly electrode structure, and FIG. 14 is a view illustrating the display devices according to FIGS. 11 and 12 and shapes of electric fields formed inside assembly holes.

Referring to FIG. 13, an electric field may be formed in an assembly hole 541 in a direction corresponding to an arrangement structure of assembly electrodes 520. When the assembly electrodes 520 are arranged in a horizontal direction as illustrated in (a) of FIG. 13, an electric field gradient is formed in the horizontal direction, and when the assembly electrodes 520 are arranged in a vertical direction as illustrated in (b) of FIG. 13, an electric field gradient is formed in the vertical direction. In addition, it can be seen from FIG. 13 that the horizontal electric field is formed with weak intensity in a relatively wide area, whereas the vertical electric field is formed strongly in a relatively narrow area.

Specifically, in the structure of (a) of FIG. 13, although an electric field is formed as a whole around a circumference of the assembly hole 541, the semiconductor light-emitting elements can be easily induced toward the assembly hole 541 due to a low density of an electric field line. However, there is a problem that a force holding the semiconductor light-emitting element seated in the assembly hole 541 is weak. In the structure of (b) of FIG. 13, since a strong electric field is concentrated on a center portion of the assembly hole 541, this structure is more advantageous than the structure of (a) of FIG. 13 in terms of fixing the semiconductor light-emitting element in the assembly hole 541, but has a difficulty in inducing the semiconductor light-emitting element toward the assembly hole 541.

Figure 14:
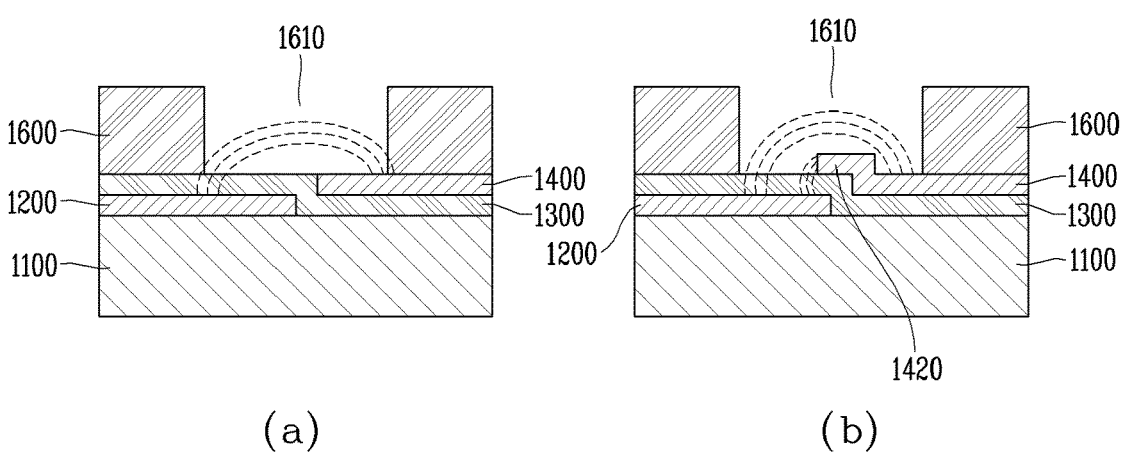
FIG. 14 is a view illustrating the display devices according to FIGS. 11 and 12 and shapes of electric fields formed inside assembly holes.

Referring to (a) of FIG. 14, the structure of the present disclosure according to FIG. 11 forms an electric field in the horizontal direction by the first electrode 1200 and the second electrode 1400, but the first electrode 1200 and the second electrode 1200 are arranged at a narrower distance than the assembly electrodes 520 of (a) of FIG. 13. This can provide an effect of forming an electric field with stronger intensity in a circumferential area of the assembly hole 1610. In addition, in the case of the structure of the present disclosure according to FIG. 12 illustrated in (b) of FIG. 14, since the extension portion 1420 of the second electrode 1400 overlaps the first electrode 1200, an electric field may be formed inside the assembly hole 1610 in the vertical and horizontal directions. According to (b) of FIG. 14, since the electric field is formed both at a circumferential portion of the assembly hole 1610 and inside the assembly hole 1610, it is easy to induce the semiconductor light-emitting element toward the assembly hole 1610. Also, the semiconductor light-emitting element seated in the assembly hole 1610 can be fixed without separation by the electric field formed in the assembly hole 1610.

The above description is only an illustrative example of the technical idea of the present disclosure, and those skilled in the art will be able to make various modifications and variations without departing from the essential characteristics of the present disclosure.

Therefore, the embodiments disclosed in the present disclosure are not intended to limit the technical spirit of the present disclosure, but to explain, and the scope of the technical spirit of the present disclosure is not limited by these embodiments.

The scope of the present disclosure should be construed according to the claims below, and all technical ideas within the scope equivalent thereto should be construed as being included in the scope of the present disclosure.

The invention claimed is:

1. A display device comprising:
   a base;
   first electrodes extending in one direction and disposed on the base at certain intervals;
   an insulating layer formed on the base to cover the first electrodes;
   second electrodes extending in the same direction as the first electrodes and formed on the insulating layer to be disposed between the adjacent first electrodes;
   a barrier rib stacked on the insulating layer and the second electrodes while forming assembly holes to overlap the first electrodes and the second electrodes;
   semiconductor light-emitting elements disposed inside the assembly holes, respectively; and
   third electrodes disposed on the barrier rib,
   wherein the semiconductor light-emitting elements are not electrically connected to the first electrodes, but electrically connected to the second electrodes and the third electrodes, and
   wherein the first electrodes and the second electrodes include:
   a first gap overlapping the assembly holes, wherein the first gap is in a range of several μm; and
   a second gap overlapping the barrier rib.

2. The display device of claim 1, wherein the first gap is in the range of 2μm to 6μm.

3. The display device of claim 2, wherein each of the first electrodes and each of the second electrodes include a first protrusion and a second protrusion, respectively, protruding toward the assembly hole, and
   wherein the first gap is a distance between the first protrusion and the second protrusion.

4. The display device of claim 3, wherein the second protrusion overlaps the assembly hole in a wider area than the first protrusion does.

5. The display device of claim 1, wherein the insulating layer is formed on the base to have a height step between a portion thereof covering the first electrodes and a portion not covering the first electrodes.

6. The display device of claim 1, wherein each of the semiconductor light-emitting elements comprises:
   a first conductive electrode;
   a first conductive semiconductor layer formed on the first conductive electrode;
   an active layer formed on the first conductive semiconductor layer;
   a second conductive semiconductor layer formed on the active layer; and
   a second conductive electrode formed on the second conductive semiconductor layer, and
   wherein the first conductive electrode is electrically connected to the second electrodes, and the second conductive electrode is electrically connected to the third electrodes.

7. The display device of claim 1, wherein the second electrodes are formed to contain at least one of Sn, Ag, Cu, Pb, Al, Cr, Bi, Cd, Fe, In, Ni, Sb, Zn, Co, and Au.

8. The display device of claim 1, further comprising a planarization layer formed on the barrier rib while filling an inside of each assembly hole,
   wherein the third electrodes are formed on the planarization layer.

9. The display device of claim 1, wherein the third electrodes are made of a transparent electrode material.

10. The display device of claim 1, wherein each of the second electrodes includes an extension portion extending to cover a portion of the first electrodes.

11. A display device comprising:

a base;

first electrodes extending in one direction and disposed on the base at certain intervals;

an insulating layer formed on the base to cover the first electrodes;

second electrodes extending in the same direction as the first electrodes and formed on the insulating layer to be disposed between the adjacent first electrodes;

a barrier rib stacked on the insulating layer and the second electrodes while forming assembly holes to overlap the first electrodes and the second electrodes;

semiconductor light-emitting elements disposed inside the assembly holes, respectively; and third electrodes disposed on the barrier rib, wherein the semiconductor light-emitting elements are not electrically connected to the first electrodes, but electrically connected to the second electrodes and the third electrodes, and wherein each of the second electrodes includes an extension portion extending from one end of the second electrodes overlapping the assembly hole onto the insulating layer so as to cover a portion of the first electrodes.

\* \* \* \* \*